United States Patent
Sood et al.

(10) Patent No.: US 8,552,893 B1
(45) Date of Patent: Oct. 8, 2013

(54) CONTROL SYSTEM USING NONLINEAR DELTA-SIGMA MODULATOR WITH SWITCHING PERIOD ERROR COMPENSATION

(75) Inventors: Mohit Sood, Austin, TX (US); Michael Allan Kost, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 91 days.

(21) Appl. No.: 13/289,806

(22) Filed: Nov. 4, 2011

Related U.S. Application Data

(60) Provisional application No. 61/410,240, filed on Nov. 4, 2010.

(51) Int. Cl.
*H03M 3/00* (2006.01)
(52) U.S. Cl.
USPC ........... 341/143; 323/205; 323/222; 323/223; 323/282; 323/283; 323/284; 323/286; 341/136; 341/140; 341/144; 341/155
(58) Field of Classification Search
USPC .......... 341/143–155; 323/205, 222, 223, 282, 323/283, 284, 286
See application file for complete search history.

(56) References Cited

U.S. PATENT DOCUMENTS

| | | | |
|---|---|---|---|
| 6,535,018 B1 * | 3/2003 | Kost | 326/68 |
| 7,081,843 B2 * | 7/2006 | Melanson | 341/143 |
| 7,084,798 B2 * | 8/2006 | Melanson | 341/143 |
| 7,190,294 B2 * | 3/2007 | Melanson | 341/143 |
| 7,515,076 B1 * | 4/2009 | Singh et al. | 341/122 |
| 7,554,473 B2 * | 6/2009 | Melanson | 341/143 |
| 7,719,246 B2 * | 5/2010 | Melanson | 323/282 |
| 7,755,525 B2 * | 7/2010 | Nanda et al. | 341/143 |
| 7,888,922 B2 * | 2/2011 | Melanson | 323/222 |
| 8,040,703 B2 * | 10/2011 | Melanson | 323/222 |

* cited by examiner

*Primary Examiner* — Lam T Mai
(74) *Attorney, Agent, or Firm* — Yudell Isidore Ng Russell PLLC; Brian F. Russell

(57) ABSTRACT

A control system provides a control signal to a nonlinear plant that generates a response signal responsive to the control signal. The control system includes a detector that detects a predetermined value of a plant quantity, valley switching logic, coupled to the detector, to change a state of a plant switch when the plant quantity is minimized, and a pulse-width modulator, coupled to the valley switching logic, to generate a control signal that controls the plant switch. The valley switching logic includes a nonlinear delta-sigma modulator that compensates for an error in a plant response signal by adjusting the duration of an on-time of a plant switch to cause an average value of the plant response signal to converge toward a target signal value.

27 Claims, 9 Drawing Sheets

US 8,552,893 B1

CONTROL SYSTEM USING NONLINEAR DELTA-SIGMA MODULATOR WITH SWITCHING PERIOD ERROR COMPENSATION

PRIORITY CLAIM

This application claims the benefit under 35 U.S.C. §119 (e) and 37 C.F.R. §1.78 of U.S. Provisional Application No. 61/410,240, filed Nov. 4, 2010, and entitled "Method and Apparatus of Correcting Error in Power Due to Error in Switching Period in a Switch Mode Power Supply," and is incorporated by reference in its entirety.

BACKGROUND OF THE INVENTION

1. Technical Field

The present invention relates in general to signal processing, and in particular, to a control system utilizing a nonlinear delta-sigma modulator with switching period error compensation.

2. Description of the Related Art

Many electronic systems utilize nonlinear processes to generate output signals. For example, plant systems, such as servo control systems and power conversion systems, often utilize nonlinear processes. Power control systems often utilize a switching power converter to perform alternating current (AC) to direct current (DC) voltage conversion or to perform DC-to-DC voltage conversion. Switching power converters often includes a nonlinear energy transfer process to provide power factor corrected energy to a load. Power control systems that provide AC-to-DC (or AC-to-AC) conversion often provide power factor corrected and regulated output voltages to many devices that utilize a regulated output voltage.

FIG. 1 illustrates a representative prior art power control system 100, which includes a switching power converter 102. Voltage source 101 supplies an alternating current (AC) input voltage $V_{in}(t)$ to a full bridge rectifier 103. Voltage source 101 can be, for example, a public utility, and the AC voltage $V_{in}(t)$ is, for example, a 60 Hz/110 V line voltage in the United States of America or a 50 Hz/230 V line voltage in Europe. Full bridge rectifier 103 rectifies the input voltage $V_{in}(t)$ and supplies a rectified, time-varying, line input voltage $V_x(t)$ to switching power converter 102.

Switching power converter 102 includes a switch 108 that operates in response to a control signal $C_S$ to regulate the transfer of energy from the rectified, time-varying input voltage $V_x(t)$, through inductor 110 to capacitor 106. Switching power converter 102 additionally includes a diode 111 that prevents reverse current flow from capacitor 106 into inductor 110.

Energy transferred through inductor 110 is stored by capacitor 106. Capacitor 106 has sufficient capacitance to maintain an approximately constant voltage $V_C$ while providing current to load 112. In at least some implementations, switching power converter 102 is a boost-type converter in which voltage $V_C$ is greater than the peak of input voltage $V_x(t)$.

In operation, input current $i_{in}$ varies over time, with a peak input current proportionate to the "on-time" of switch 108 and with the energy transferred to capacitor 106 proportionate to the "on-time" squared. Thus, this energy transfer process is one example of a nonlinear process. In some implementations, switch 108 is an n-channel field effect transistor (FET), and control signal $C_S$ is a pulse width modulated (PWM) control signal that causes switch 108 to conduct when the pulse width of $C_S$ is high. Thus, in such implementations, the "on-time" of switch 108 is determined by the pulse width of control signal $C_S$, and the energy transferred from $V_x(t)$ to capacitor 106 is proportionate to a square of the pulse width of control signal $C_S$.

Power control system 100 also includes a switch state controller 114 that generates control signal $C_S$ with a goal of causing switching power converter 102 to transfer a desired amount of energy to capacitor 106, and thus, to load 112. The desired amount of energy depends upon the voltage and current requirements of load 112. To provide power factor correction close to one, switch state controller 114 generally seeks to control input current $i_{in}$ so that input current $i_{in}$ tracks input voltage $V_x(t)$ while holding capacitor voltage $V_C$ constant.

In implementations of switching power converter 102 in which switch 108 is implemented with a FET, one known issue is that the inherent capacitance of the FET undesirably resonates with inductor 110 after input current in inductor 110 is demagnetized. A known technique to minimize such resonance and to reduce the attendant switching losses is so-called "valley switching" in which control signal $C_S$ is controlled to turn on switch 108 when the drain voltage $V_D$ of the FET reaches it minimum value.

Referring now to FIG. 2, there is depicted a timing diagram of a prior art technique for valley switching implemented by switch state controller 114. In the depicted timing diagram, switch state controller 114 waits for a calculated switching period (TT) to complete and then asserts control signal $C_S$ to turn on switch 108 after some delay $TT_{err}$ in order to hit the valley of drain voltage $V_D$. As shown in FIG. 2, this control technique results in an extension of switching period TT by $TT_{err}$ to a obtain a switching period of TT'.

As can be seen from FIG. 2, the conventional valley switching technique leads to a reduction in the average current supplied to load 112 to less than the intended amount. In particular, the intended output current supplied to the load is given as $I_{outTT}=Q_2/TT$, while in practice the actual output current is given as $I_{outTT'}=Q2/TT'$. That is, because $TT_{err}$ is always positive in valley switching, $I_{outTT'}$ is always less than $I_{outTT}$. The drop in output current $I_{outTT'}$ ultimately leads to a reduction in the maximum output power that can be delivered to load 112.

SUMMARY OF THE INVENTION

In at least one embodiment, a signal processing system includes a nonlinear delta-sigma modulator that compensates for an error in a plant response signal by adjusting a duration of an on-time interval of a plant switching period to cause an average value of the plant response signal to converge toward a target signal value.

In a further embodiment, a control system provides a control signal to a nonlinear plant that generates a response signal responsive to the control signal. The control system includes a detector that detects a predetermined value of a plant quantity, valley switching logic, coupled to the detector, to change a state of a plant switch when the plant quantity is minimized, and a pulse-width modulator, coupled to the valley switching logic, to generate a control signal that controls the plant switch. The valley switching logic includes a nonlinear delta-sigma modulator that compensates for an error in a plant response signal by adjusting the duration of an on-time of a plant switch to cause an average value of the plant response signal to converge toward a target signal value.

In another embodiment, a method of processing signals utilizing a nonlinear delta-sigma modulator includes receiving, in a nonlinear delta-sigma modulator, a signal related via a nonlinear function to a time interval in a plant switching period. In a forward path of the nonlinear delta-sigma modulator, the time interval in the plant switching period is determined by application of a nonlinear loop filter. A feedback path of the nonlinear delta-sigma modulator compensates for an error in a plant response signal by adjusting a duration of the time interval to cause an average value of the plant response signal to converge toward a target signal value.

DETAILED DESCRIPTION OF ILLUSTRATIVE EMBODIMENT

Figure 3:
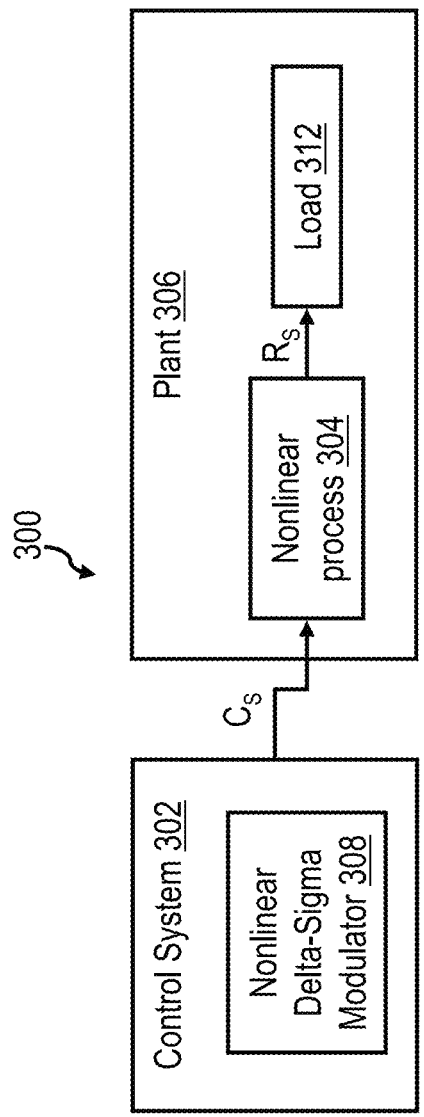
FIG. 3 depicts a representative plant and control system.

With reference again to the figures and with particular reference to FIG. 3, there is illustrated a high level block diagram of an exemplary plant and control system 300 in accordance with one embodiment. Plant and control system 300 includes control system 302 and plant 306. Control system 302 generates a control signal $C_S$ that controls a nonlinear process 304 of plant 306. In response to control signal $C_S$, nonlinear process 304 generates a response signal $R_S$. In at least one embodiment, nonlinear process 304 includes a square function. For example, in at least one embodiment, plant 306 is a power converter, and nonlinear process 304 represents an energy transfer process from an input stage to a load 312. Load 312 can be any load and can include, for example, another power transfer stage. Control system 302 includes a nonlinear delta-sigma modulator 308, which is used by control system 302 to generate control signal $C_S$.

In at least one embodiment, control system 302 generates control signal $C_S$ so that the frequency spectrum of the response signal $R_S$ is noise-shaped, that is, noise is shifted out of the response signal $R_S$ baseband frequencies and into out-of-band frequencies. Many plants have a natural low pass frequency response. Thus, noise shaping removes noise at low frequencies and prevents the noise from otherwise becoming part of the control signal $C_S$. Shifting noise out of the baseband of response signal $R_S$ removes unwanted signal components from response signal $R_S$ that could, for example, adversely affect the operation of load 312 and/or be parasitically coupled to other circuits in the plant 306. Control system 302 facilitates the noise shaping of response signal $R_S$ by internally modeling nonlinear process 304.

Figure 4:
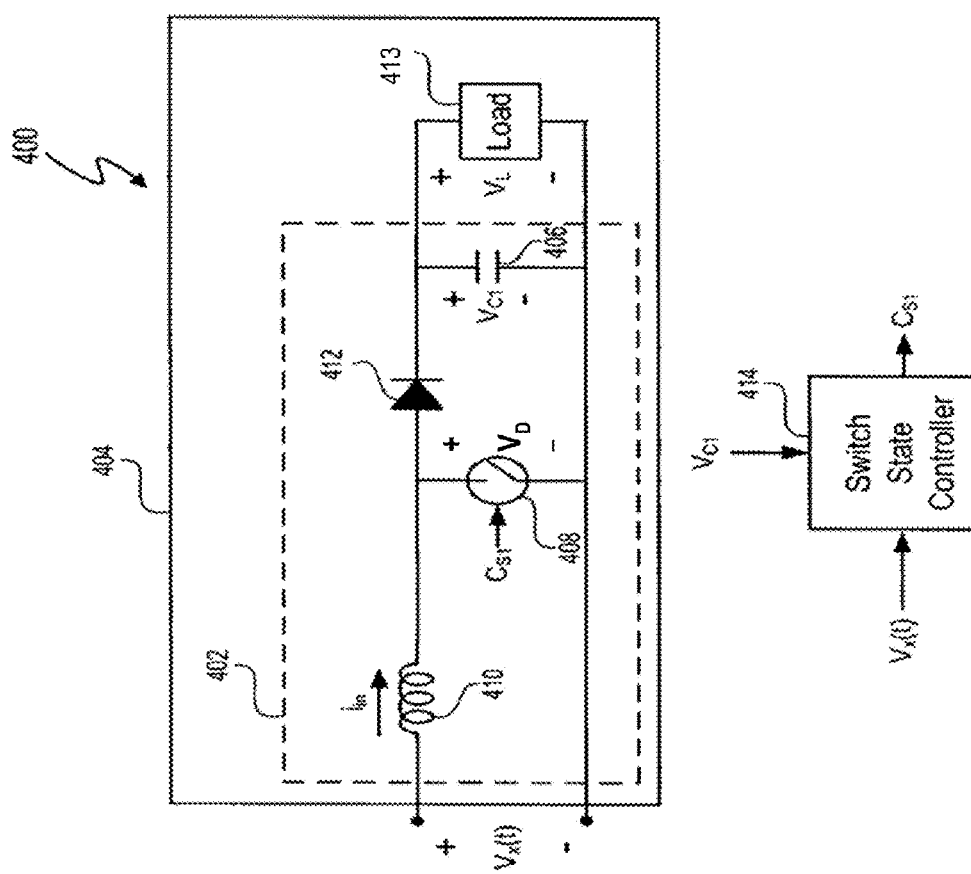
FIG. 4 illustrates a representative plant and control system including a switching power converter.

FIG. 4 depicts a representative plant and control system 400, which is one embodiment of plant and control system 300. Plant and control system 400 includes a switching power converter 402 and a plant 404. Plant 404 represents an embodiment of plant 306. Switching power converter 402 operates in accordance with a nonlinear process in discontinuous current mode. Switch 408 of switching power converter 402 is a power factor regulation switch that regulates the transfer of energy from the rectified, time-varying input voltage $V_x(t)$, through inductor 410 and diode 412 to capacitor 406, which stores the energy and supplies a load current to load 413. The value of capacitor 406 is selected to be sufficiently high such that capacitor 406 maintains an approximately constant voltage $V_{C1}$ while providing current to load 413. In at least one embodiment, the switching power converter 402 is a boost-type converter, meaning voltage $V_{C1}$ is greater than the peak voltage $V_{peak}$ of input voltage $V_x(t)$.

The peak of input current $i_{in}$ through inductor 410 is proportionate to the "on-time" of switch 408, and the energy transferred is proportionate to the switch "on-time" squared. In at least one embodiment, control signal $C_{S1}$ is a pulse-width modulated (PWM) signal, and switch 408 is an n-channel field effect transistor (FET) that conducts when the pulse width of $C_{S1}$ is high. In this embodiment, the "on-time" of switch 408 is determined by the pulse width of control signal $C_{S1}$, and the energy transferred to capacitor 406 is proportionate to a square of the pulse width of control signal $C_{S1}$. Thus, the energy transfer process represents one embodiment of nonlinear process 304.

As further illustrated in FIG. 4, plant and control system 400 also includes a switch state controller 414, which represents one embodiment of control system 302. Switch state controller 414 controls the pulse width PW and period T of control signal $C_{S1}$. Thus, switch state controller 414 controls the nonlinear process of switching power converter 402 so that capacitor 406 is transferred a desired amount of energy that satisfies the voltage and current requirements of load 413. The duty cycle of control signal $C_{S1}$ is set to maintain the desired capacitor voltage $V_{C1}$ and load voltage $V_L$, and in at least one embodiment, the duty cycle D of control signal $C_{S1}$ equals $[V_L/(V_{C1}+V_L)]$. In some implementations, the duty cycle D and the switching frequency of control signal $C_{S1}$ vary with time.

Energy transfer increases during a period of time as the input voltage $V_x(t)$ increases. To regulate the amount of energy transferred and maintain a power factor correction close to one, switch state controller 414 varies the period of control signal $C_{S1}$ so that the input current tracks the changes in input voltage $V_x(t)$ and holds the capacitor voltage $V_{C1}$ substantially constant. Thus, as the input voltage $V_x(t)$ increases, switch state controller 414 increases the period T of control signal $C_{S1}$, and as the input voltage $V_x(t)$ decreases, switch state controller 414 decreases the period of control signal $C_{S1}$. At the same time, the pulse width PW of control signal $C_{S1}$ is adjusted to maintain a constant duty cycle D, and thus, holds capacitor voltage $V_{C1}$ substantially constant. In at least one embodiment, switch state controller 414 updates control signal $C_{S1}$ at a frequency much greater than the frequency of input voltage $V_x(t)$. Because input voltage $V_x(t)$ is generally a rectified line voltage of a public utility, the frequency of input voltage $V_x(t)$ is generally 50-60 Hz. The frequency 1/T of control signal $C_{S1}$ is, for example, between 25 kHz and 100 kHz. Frequencies at or above 25 kHz avoid audio frequencies and at or below 100 kHz avoid significant switching inefficiencies while still maintaining good power factor correction (e.g., between 0.9 and 1) and an approximately constant capacitor voltage $V_{C1}$.

Figure 5:
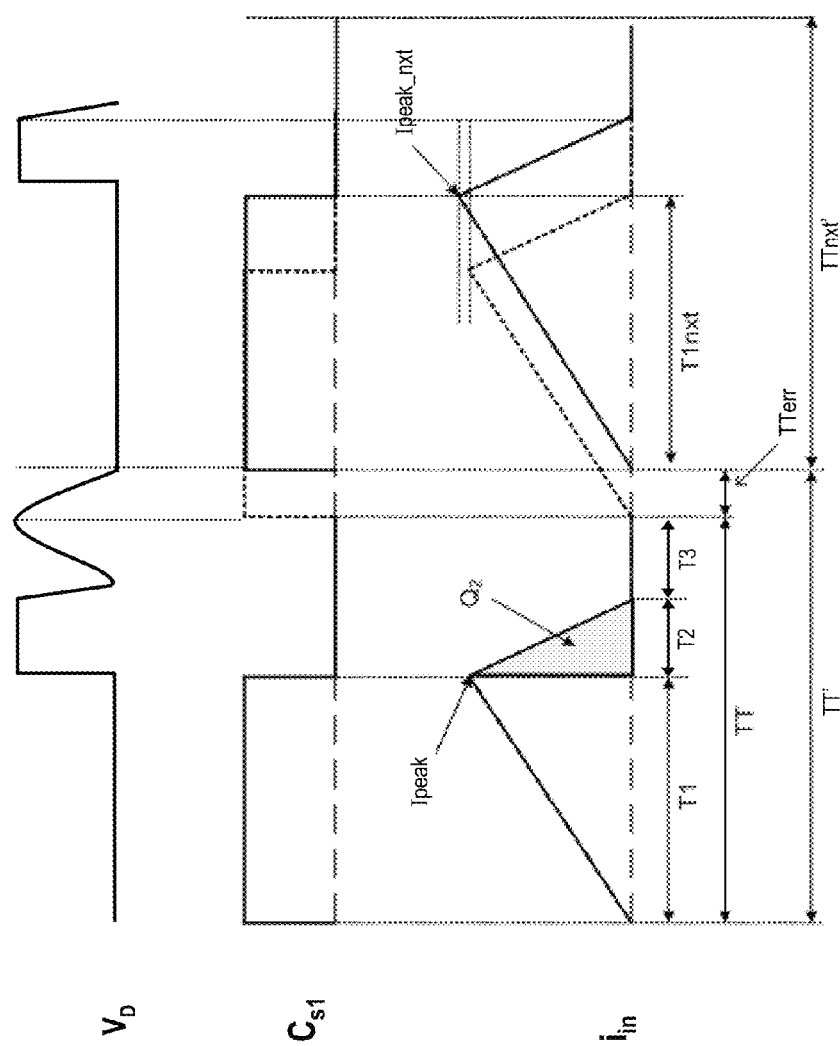
FIG. 5 is a timing diagram illustrating switching period error correction.

With reference now to FIG. 5, there is illustrated a timing diagram of a technique for valley switching implemented by switch state controller 414. In the depicted timing diagram, each switching period TT of control signal $C_{S1}$ includes three sequential time intervals: (1) interval T1 in which control signal $C_{S1}$ is asserted, switch 408 is turned on, and input current $i_{in}$ rises from zero to peak input current $I_{peak}$, (2) interval T2 in which control signal $C_{S1}$ is not asserted, switch 408 is off, and input current $i_{in}$ falls from peak input current $I_{peak}$ to zero, and (3) interval T3 in which control signal $C_{S1}$ is not asserted, switch 408 is off, and input current $i_{in}$ remains at zero. The next switching period TTnxt does not begin immediately at the conclusion of interval T3; instead, switch state controller 414 waits for the calculated switching period (TT) to complete, senses a zero crossing of drain voltage $V_D$, and then asserts control signal $C_{S1}$ to turn on switch 408 after some delay $TT_{err}$ (which can be fixed or calculated) in order to hit the valley of drain voltage $V_D$. As shown in FIG. 5, this control technique results in an extension of switching period TT by period extension $TT_{err}$ to obtain an overall switching period of TT'.

Figure 1:
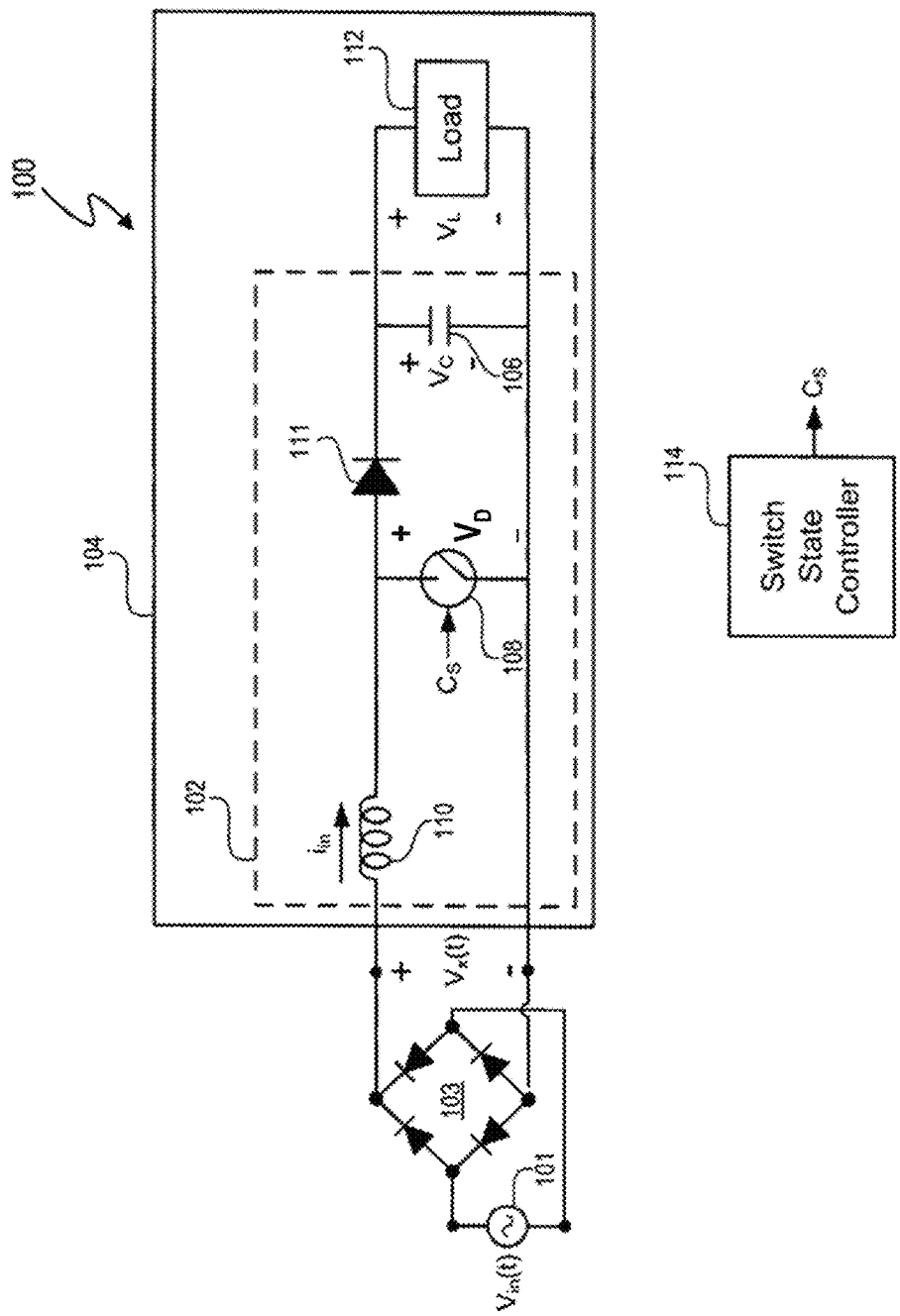
FIG. 1 illustrates a representative prior art power control system.
Figure 2:
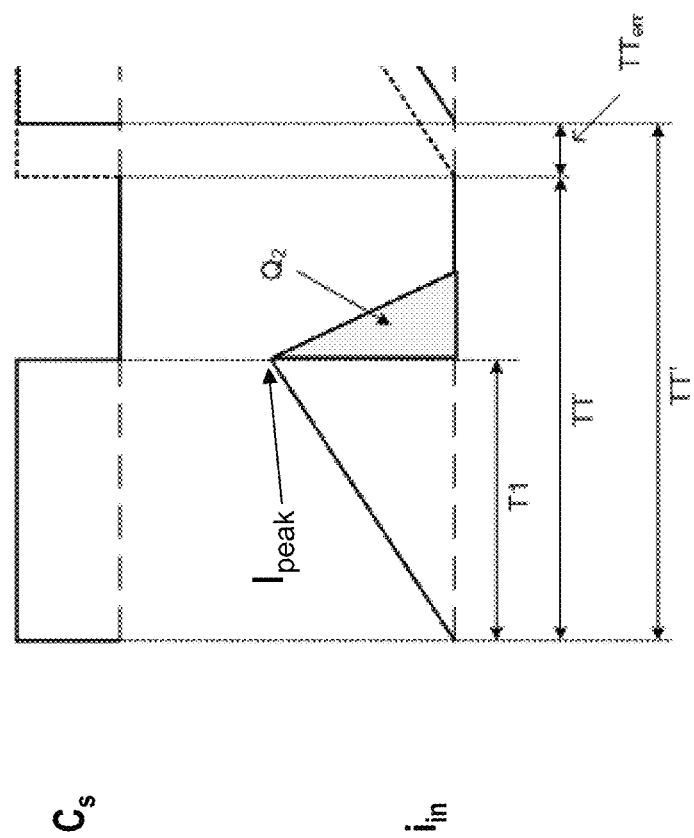
FIG. 2 is a timing diagram illustrating a conventional valley switching technique utilized to control the switch of the power control system of FIG. 1.

As described above with reference to FIG. 2, prior art valley switching led to a reduction in the average output current and maximum output power that can be supplied to load 413. However, as shown in FIG. 5, switch state controller 414 ameliorates the effects of valley switching by compensating for the decrease in average output current $i_{out}$ in the next switching cycle. In particular, switch state controller 414 measures overall switching period TT' (and/or period extension $TT_{err}$) and modifies the duration of assertion of $C_{S1}$ and thus interval T1 of the next switching period (referred to herein as T1nxt) in accordance with the difference in the average output current $i_{out}$, which is given as $i_{out}=Q2/TT-Q2/TT'$. Modifying the duration of assertion of $C_{S1}$ and T1nxt in this manner yields a different peak input current $I_{peak\_nxt}$ in the next overall switching period TTnxt', which compensates for the decrease in the average output current in the immediately previous switching period.

Figure 6:
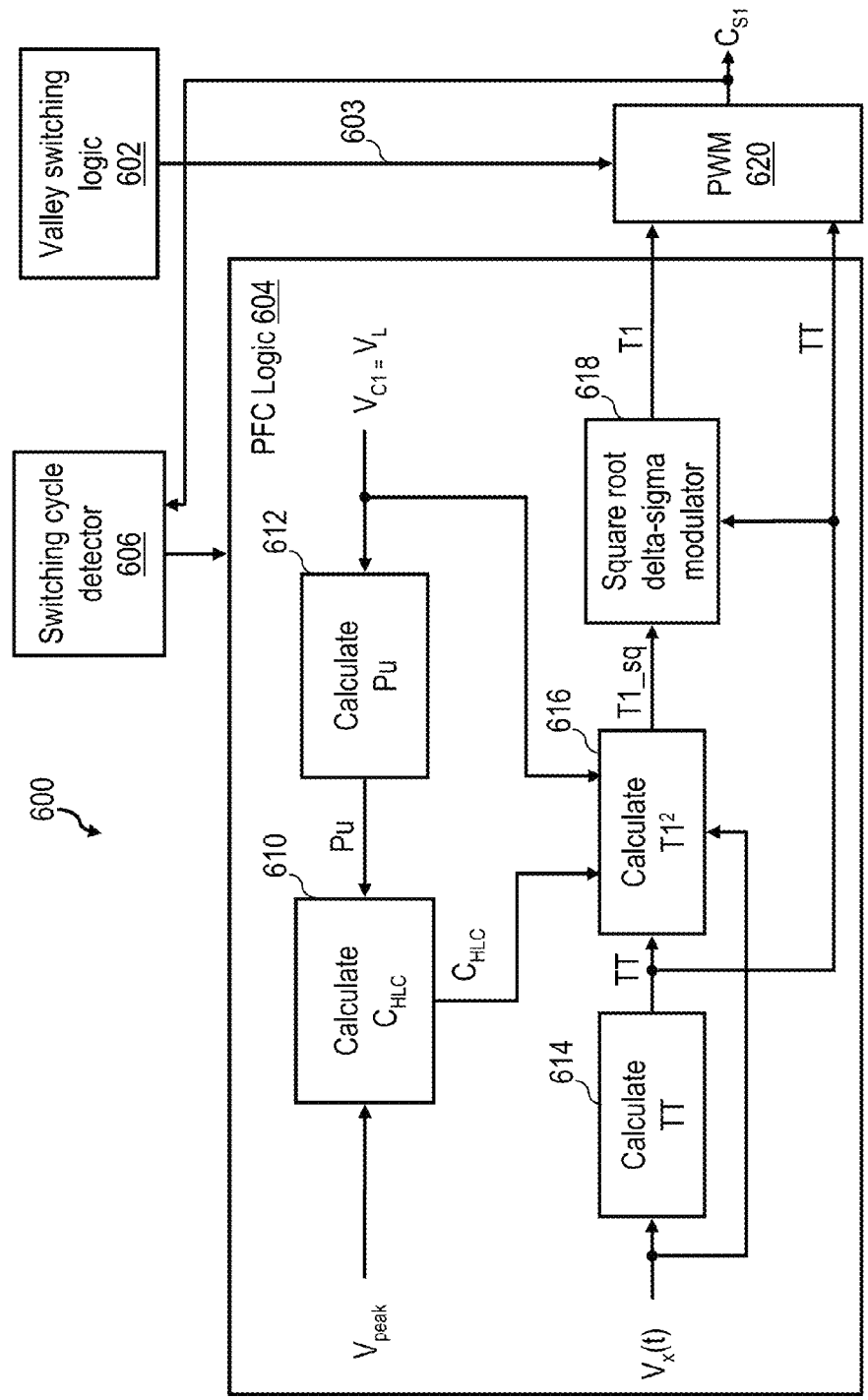
FIG. 6 depicts a representative switch state controller that implements switching period error correction.

Referring now to FIG. 6, there is depicted a switch state controller 600 that is an embodiment of switch state controller 414 of FIG. 4. In the depicted embodiment, switch state controller 600 includes valley switching logic 602 coupled to a pulse-width modulator (PWM) 620 that outputs control signal $C_{S1}$. Valley switching logic 602 implements valley switching as illustrated in FIG. 5 and accordingly asserts its output signal 603 when drain voltage $V_D$ reaches a minimum value in order to synchronize the assertion of control signal $C_{S1}$ by PWM 620 with the valley in drain voltage $V_D$.

Switch state controller 600 further includes power factor correction (PFC) logic 604 and a switching cycle detector 606 that provides to PFC logic 604 an indication of the actual duration of overall switching period TT' (and/or extension $TT_{err}$) based on control signal $C_{S1}$ output by PWM 620.

As further illustrated in FIG. 6, PFC logic 604 includes calculation blocks 610, 612, 614 and 616 and a square root delta-sigma modulator 618, which all can be implemented, for example, in digital integrated circuitry. PFC logic 604 outputs values of interval T1 and switching period TT to PWM 620, which utilizes these values to determine the pulse width of control signal $C_{S1}$.

As evident from the trigonometric relationship illustrated in FIG. 5, the charge Q2 delivered to load 413 during interval T2 and thus the average output current $i_{out}$ is related to the peak current $I_{peak}$ and the duration of interval T2 as follows:

$$Q_2 = \frac{I_{peak}T_2}{2} \quad \text{(Eq. 1)}$$

This relation can be extended to express $I_{peak}$ and $T_2$ in terms of the inductance L of inductor 410, rectified input voltage $V_x(t)$ and output voltage $V_{C1}$ as follows:

$$Q_2 = \frac{I_{peak}T_2}{2} = \frac{V_{x(t)}^2 T_1^2}{2(V_{C1}-V_{x(t)})L} \quad \text{(Eq. 2)}$$

Further, because rectified input voltage $V_x(t)$, output voltage $V_{C1}$ (or $V_L$) and inductance L are all constant under normal operating conditions, charge $Q_2$ can properly be expressed as a constant K multiplied by the square of interval T1 as follows:

$$Q_2 = K \times T1\_sq \quad \text{(Eq. 3)}$$

where T1_sq is the digitally quantized value of $T1^2$.

In the embodiment of FIG. 6, PFC logic 604 receives rectified input voltage $V_x(t)$, the peak input voltage $V_{peak}$, and output voltage $V_L$ (i.e., $V_{C1}$) as inputs. Calculation block 612 calculates and outputs a scale factor Pu based on a comparison of $V_L$ to a designed target load voltage $V_{target}$ for load 413. Based on scale factor Pu and peak input voltage $V_{peak}$, calculation block 610 calculates half-line cycle $C_{HLC}$. For example, in one embodiment, half-line cycle $C_{HLC}$ is computed as:

$$C_{HLC} = TT_{min}\left(\frac{V_{minpeak}}{V_{avgpeak}}\right)^2 \left(\frac{V_{target}-V_{minpeak}}{V_{target}^2}\right)Pu \quad \text{(Eq. 4)}$$

where $TT_{min}$ is the predetermined minimum duration of switching period TT, $V_{minpeak}$ is the minimum peak input voltage of $V_x(t)$ and $V_{avgpeak}$ is the average peak input voltage of $V_x(t)$.

Calculation block 614 additionally calculates switching period TT. For example, in one embodiment, switching period TT is calculated as:

$$TT = TT_{min}\left(2 - \frac{V_x(t)}{V_{avgpeak}}\right)G_{TT} + N \quad \text{(Eq. 5)}$$

where $G_{TT}$ is additional gain on TT (e.g., based on the value of Pu or $V_{peak}$) and N is a constant. Calculation block 614 provides the calculated switching period TT to calculation block 616 and to PWM 620.

Based on switching period TT, $V_x(t)$, $V_L$, and $C_{HLC}$, calculation block 616 calculates the value of T1_sq. For example, in one embodiment, T1_sq is determined as follows:

$$T1\_sq = TT(V_L - V_x(t))C_{HLC} \quad \text{(Eq. 6)}$$

Square root delta-sigma modulator 618 determines the duration of interval T1 by performing a square root function on the value of T1_sq output by calculation block 616. In addition, square root delta-sigma modulator 618 compensates for time quantization error inherent in computing T1_sq, which is equal to the difference between the computed and actual squares of interval T1 (i.e., $T1\_sq - T1^2$). The time quantization error for interval T1 is directly related to charge Q2 by constant K as shown in Eq. 3. The following relations therefore follow, where Q2 and $I_{out}$ are the desired output charge in switching period TT and desired average output current in switching period TT, respectively, and Q2' and $I_{out}'$ are the actual charge in switching period TT' and actual average output current in switching period TT', respectively:

$$Q_2 - Q_2' = K(T1\_sq/TT - T1^2/TT) \times TT' = K(T1\_sq \times TT'/TT - T1^2) \quad \text{(Eq. 7)}$$

$$I_{out} - I_{out}' = K(T1\_sq/TT - T1^2/TT') \quad \text{(Eq. 8)}$$

Thus, the total error TE, including both the time quantization error and switching period error, can be expressed as:

$$TE = (T1\_sq \times TT'/TT - T1^2) \quad \text{(Eq. 9)}$$

Alternatively expressed in terms of $TT_{err}$:

$$\begin{aligned} TE &= (T1\_sq \times TT'/TT - T1^2) \\ &= ((T1\_sq/TT \times TT_{err} + T1\_sq - T1^2) \end{aligned} \quad \text{(Eq. 10)}$$

Because square-root delta sigma modulator 618 of PFC logic 604 compensates for both time quantization error and switching, PFC logic 604 is also referred to herein as compensation logic.

Figure 7:
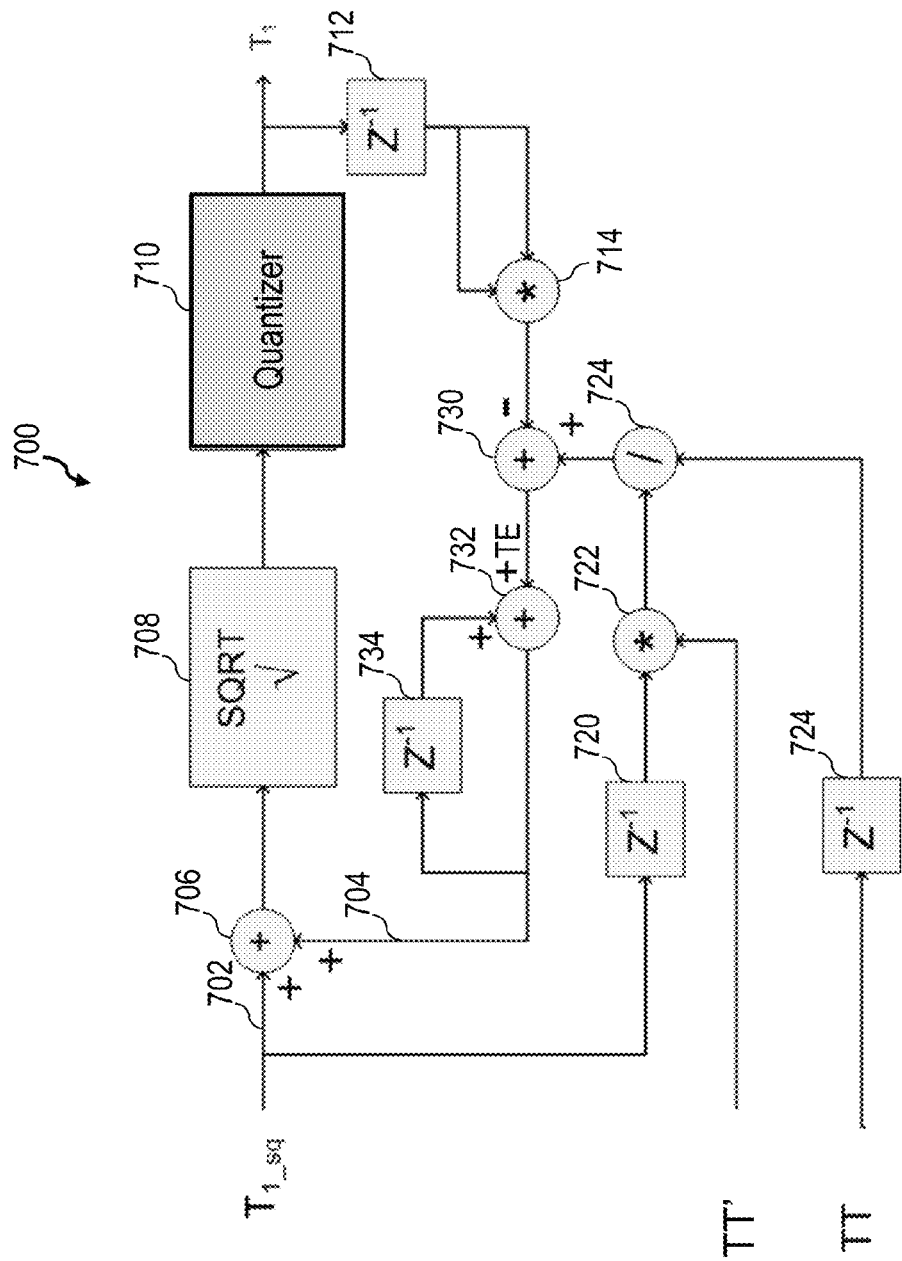
FIG. 7 illustrates a representative first embodiment of a nonlinear delta-sigma modulator that implements switching period and quantization error correction.

With reference now to FIG. 7, there is illustrated a nonlinear delta-sigma modulator 700 that is a first embodiment of square root delta-sigma modulator 618 of FIG. 6. Nonlinear delta-sigma modulator 700 computes and corrects for total error TE in accordance with Eq. 9.

As illustrated, nonlinear delta-sigma modulator 700 receives as inputs the computed switching period TT output by calculation block 614, the actual switching period TT' measured by switch state controller 414, and the value of T1_sq output by calculation block 616. Along a forward path 702, combiner 706 sums the input value of T1_sq with a feedback signal received from feedback path 704. The resulting signal output from combiner 706 is received by loop filter 708, which performs a square root calculation. The result of the square root calculation is then fed to quantizer 710. The output signal of quantizer 710 represents the interval T1 for which pulse width modulator 620 of switch state controller 600 asserts control signal $C_{S1}$.

The quantizer output signal representing interval T1 is also fed back through delay 712 and squared by combiner 714 to compute $T1^2$, which is one term of the total error TE. The other term of the total error TE (viz. T1_sq×TT'/TT) is computed by application of a delay 720 to the input T1_sq, multiplying the resulting signal with measured switching period TT' at combiner 722 and dividing the resulting product at combiner 724. The difference between the output of combiner 724 and the output of combiner 714 is then determined by combiner 730 to obtain the total error TE for the current switching period. The total error TE for the current switching period is then accumulated by combiner 732 with the previous cumulative total error TE output by delay 734 to obtain the feedback signal summed with T1_sq by combiner 706.

Figure 8:
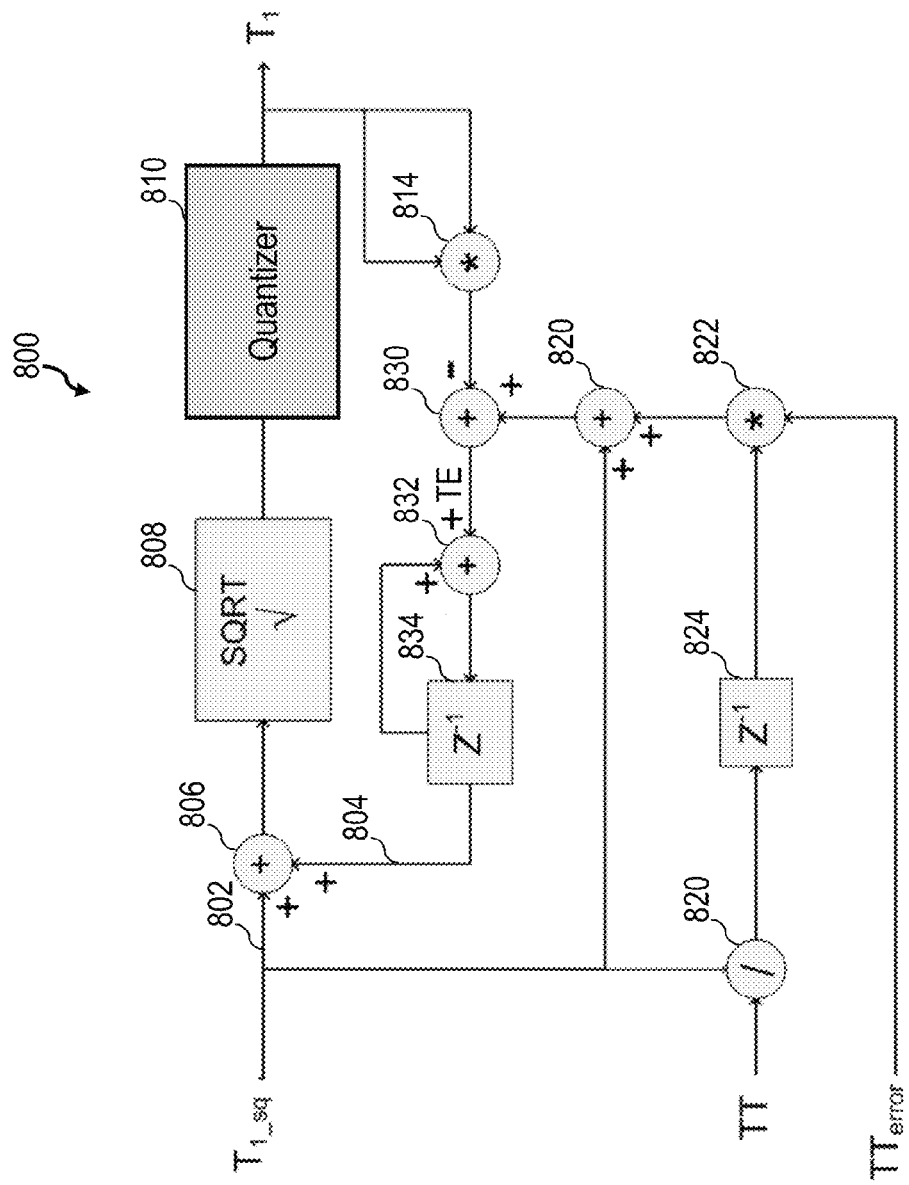
FIG. 8 depicts a representative second embodiment of a nonlinear delta-sigma modulator that implements switching period and quantization error correction.

Referring now to FIG. 8, there is illustrated a nonlinear delta-sigma modulator 800 that is a second embodiment of square root delta-sigma modulator 618 of FIG. 6. Nonlinear delta-sigma modulator 800 computes and corrects for total error TE in accordance with Eq. 10.

As illustrated, nonlinear delta sigma modulator 800 receives as inputs the computed switching period TT output by calculation block 614, the switching period error $TT_{err}$ measured by switch state controller 600, and the value of T1_sq output by calculation block 616. Along a forward path 802, combiner 806 sums the input value of T1_sq with a feedback signal received from feedback path 804. The resulting signal output from combiner 806 is received by loop filter 808, which performs a square root calculation. The result of the square root calculation is then fed to quantizer 810. The output signal of quantizer 810 represents an interval T1 for which pulse width modulator 620 of switch state controller 600 asserts control signal $C_{S1}$.

The quantizer output signal representing interval T1 is also fed back and squared by combiner 814 to compute $T1^2$, which is one term of the total error TE. A second term of the total error TE (viz. T1_sq/TT×$TT_{err}$) is computed by dividing T1_sq by switching period TT at combiner 820, delaying the resulting quotient at delay 824 and multiplying the resulting value by switching period error $TT_{err}$ at combiner 822. The product output by combiner 822 is then summed with the input value of T1_sq by combiner 820. The difference between the output of combiner 820 and the output of combiner 814 is then determined by combiner 830 to obtain the total error TE for the current switching period. The total error TE for the current switching period is then accumulated by combiner 832 with the previous cumulative total error TE output by delay 834 to obtain the feedback signal that, after application of delay 834, is summed with T1_sq by combiner 806.

Figure 9:
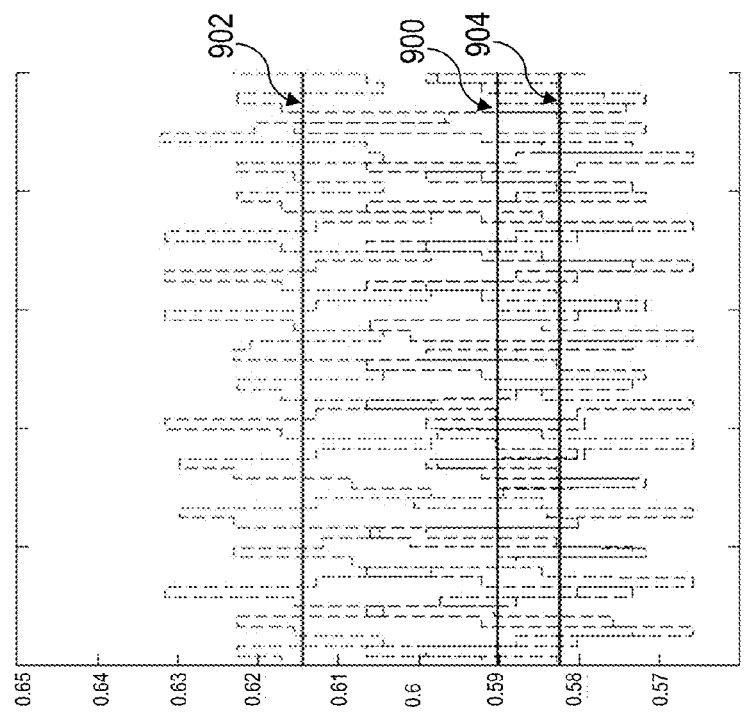
FIG. 9 is a timing diagram illustrating pulse width scaling factor with and without switching period error correction.

FIG. 9 is a timing diagram illustrating simulation results obtained for scaling factor Pu for a given output voltage $V_L$. In the timing diagram, line 900 represents the mean value of the waveform representing the time-varying value of Pu if switch state controller 414 does not implement valley switching. In this case, Pu has a mean value of approximately 0.59. If switch state controller 414 implements valley switching but no timing error compensation, the mean value of the time-varying value of Pu is approximately 0.615, as indicated by line 902. The increase in the mean value of Pu of approximately four percent (4%) in this case reflects a corresponding decrease in the maximum output power that can be delivered to load 413.

The application of error compensation by switch state controller 414 as described herein corrects for the diminution in the maximum output power that can be delivered to load 413. In particular, line 904 represents the mean value of the waveform representing the time-varying value of Pu if switch state controller 414 implements both valley switching timing error compensation. In this case, the mean value of 0.583 indicated by line 904 closely approximates the original value of 0.59.

In at least some embodiments, switch state logic 600 includes timeout logic so that if valley switching logic 602 fails to resolve, switch state logic 600 will still turn on switch 408. The extension of the switching period by occurrence of a timeout will automatically be compensated for by square root delta-sigma modulator 618. Further, in at least some embodiments, switch state logic 600 includes protection logic that forces period $TT_{err}$ to zero under protection conditions, for example, when control signal $C_{S1}$ has been off for a long period during a system fault. Such protection logic prevents square root delta-sigma modulator 618 from erroneously continuing to accumulate period $TT_{err}$ during system faults.

As has been described, a control system compensates for switching period error in a plant. The compensation technique can be applied to a variety of plants, including switching power converters of various topologies including but not limited to boost-type power converters. Further, the switching period error for which the control system compensates can either be positive (increasing the switching period) or negative (decreasing the switching period).

While the present invention has been particularly shown as described with reference to one or more preferred embodiments, it will be understood by those skilled in the art that various changes in form and detail may be made therein without departing from the spirit and scope of the invention. For example, although aspects have been described with respect to a computer system executing program code that directs the functions of the present invention, it should be understood that present invention may alternatively be implemented as a program product including a storage medium (or storage device) storing program code that can be processed by a processing device or processing system. Alternatively, the described invention could be implemented entirely in analog circuitry.

As an example, the program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

What is claimed is:

1. A signal processing system, comprising:
a nonlinear delta-sigma modulator that compensates for an error in a plant response signal by adjusting a duration of an on-time interval of a plant switching period to cause an average value of the plant response signal to converge toward a target signal value, wherein the nonlinear delta-sigma modulator includes:
a loop filter having an input;
a quantizer coupled to the loop filter, the quantizer having an output; and
a feedback path coupled between the output of the quantizer and the input of the loop filter, wherein the feedback path determines an error for a switching period of the plant switch.

2. The signal processing system of claim 1, wherein the nonlinear delta-signal modulator comprises a square root delta-sigma modulator.

3. A signal processing system, comprising:
a nonlinear delta-sigma modulator that compensates for an error in a plant response signal by adjusting a duration of an on-time interval of a plant switching period to cause an average value of the plant response signal to converge toward a target signal value;
wherein the plant response signal is output current; and
wherein the nonlinear delta-sigma modulator adjusts an on-time of a plant switch in the plant switching period to compensate for a difference in the average value of the output current from the target signal value in a prior plant switching period.

4. A signal processing system, and further comprising:
a nonlinear delta-sigma modulator that compensates for an error in a plant response signal by adjusting a duration of an on-time interval of a plant switching period to cause an average value of the plant response signal to converge toward a target signal value; and
a switch state controller including the nonlinear delta-sigma modulator and further including a quantizer having an associated quantizer error, and wherein the nonlinear delta-sigma modulator further compensates for the quantizer error.

5. A signal processing system, comprising:
a nonlinear delta-sigma modulator that compensates for an error in a plant response signal by adjusting a duration of an on-time interval of a plant switching period to cause an average value of the plant response signal to converge toward a target signal value; and
a switching power converter that transfers energy from a time-varying voltage source through an inductor in response to a state of a power factor regulation switch controlled based on an output of the nonlinear delta-sigma modulator.

6. The signal processing system of claim 5, and further comprising a pulse-width modulator, coupled to the nonlinear delta-sigma modulator, to generate a control signal that determines the state of the power factor regulation switch.

7. A signal processing system, comprising:
a nonlinear delta-sigma modulator that compensates for an error in a plant response signal by adjusting a duration of an on-time interval of a plant switching period to cause an average value of the plant response signal to converge toward a target signal value; and
a power factor correction circuit including the nonlinear delta-sigma modulator.

8. The signal processing system of claim 7, and further comprising valley switching logic that synchronizes the plant switching period with occurrence of a minimum value of a detected plant signal.

9. A signal processing system, comprising:
a nonlinear delta-sigma modulator that compensates for an error in a plant response signal by adjusting a duration of an on-time interval of a plant switching period to cause an average value of the plant response signal to converge toward a target signal value, wherein the nonlinear delta-sigma modulator includes:
a loop filter having an input;
a quantizer coupled to the loop filter, the quantizer having an output; and
a feedback path coupled between the output of the quantizer and the input of the loop filter, wherein the feedback path determines an error for a plant switching period, wherein the feedback path further includes a combiner that calculates an accumulated error for multiple plant switching periods.

10. A signal processing system, comprising:
a nonlinear delta-sigma modulator that compensates for an error in a plant response signal by adjusting a duration of an on-time interval of a plant switching period to cause an average value of the plant response signal to converge toward a target signal value, wherein the nonlinear delta-sigma modulator includes:
a loop filter having an input;
a quantizer coupled to the loop filter, the quantizer having an output; and
a feedback path coupled between the output of the quantizer and the input of the loop filter, wherein the feedback path determines an error for a plant switching period;
wherein:
the nonlinear delta-sigma modulator includes a combiner coupled to the input of the loop filter that combines a modulator input with a signal from the feedback path; and the feedback path determines the error based in part on the modulator input.

11. A control system to provide a control signal to a nonlinear plant that generates a response signal responsive to the control signal, the control system comprising:
   valley switching logic to change a state of a plant switch when the plant quantity is minimized;
   compensation logic including a nonlinear delta-sigma modulator that compensates for an error in a plant response signal by adjusting a duration of an on-time of a plant switch to cause an average value of the plant response signal to converge toward a target signal value; and
   a pulse-width modulator, coupled to the valley switching logic and the compensation logic, to generate a control signal that controls the plant switch.

12. The control system of claim 11, wherein:
   the plant response signal is output current; and
   the compensation logic adjusts the duration of assertion of the control signal by the pulse-width modulator in a plant switching period to compensate for a difference in the average value of the output current from the target signal value in a prior plant switching period.

13. The control system of claim 11, wherein the nonlinear delta-signal modulator comprises a square root delta-sigma modulator.

14. The control system of claim 11, wherein the compensation logic includes a quantizer having an associated quantizer error, and wherein the nonlinear delta-sigma modulator further compensates for the quantizer error.

15. The control system of claim 11, wherein:
   the plant includes a switching power converter that transfers energy from a time-varying voltage source through an inductor in response to a state of the plant switch; and
   the compensation logic comprises a power factor correction circuit.

16. The control system of claim 11, wherein the nonlinear delta-sigma modulator includes:
   a loop filter having an input;
   a quantizer coupled to the loop filter, the quantizer having an output; and
   a feedback path coupled between the output of the quantizer and the input of the loop filter, wherein the feedback path determines an error for a switching period of the plant switch.

17. The control system of claim 16, wherein the feedback path further includes a combiner that calculates an accumulated error for multiple plant switching periods.

18. The control system of claim 16, wherein:
   the nonlinear delta-sigma modulator includes a combiner coupled to the input of the loop filter that combines a modulator input with a signal from the feedback path; and
   the feedback determines the error based in part on the modulator input.

19. A method of processing signals utilizing a nonlinear delta-sigma modulator, the method comprising:
   in a nonlinear delta-sigma modulator, receiving a signal related via a nonlinear function to a time interval in a first plant switching period;
   in a forward path of the nonlinear delta-sigma modulator, determining the time interval in the first plant switching period by application of a nonlinear loop filter; and
   in a feedback path of the nonlinear delta-sigma modulator, compensating for an error in a plant response signal by adjusting a duration of the time interval in a subsequent second plant switching period to cause an average value of the plant response signal to converge toward a target signal value.

20. The method of claim 19, wherein the plant response signal is output current.

21. The method of claim 19, wherein the time interval is an on-time of a plant switch.

22. The method of claim 19, wherein determining the time interval comprises applying square root loop filter.

23. The method of claim 19, wherein:
   the method further comprises, in the forward path of the nonlinear delta-sigma modulator, quantizing the time interval in a quantizer having an associated quantizer error;
   wherein the compensating includes compensating for the quantizer error.

24. The method of claim 19, and further comprising:
   generating a pulse-width modulated control signal that determines the plant switching period based on an output of the forward path of the nonlinear delta-sigma modulator.

25. The method of claim 19, and further comprising generating an input of the forward path in a power factor correction circuit that includes the nonlinear delta-sigma modulator.

26. The method of claim 19, and further comprising:
   in the feedback path, calculating an accumulated error for multiple plant switching periods.

27. The method of claim 19, wherein:
   in the forward path, summing a modulator input with a signal from the feedback path; and
   the compensating includes determining the error based in part on the modulator input.

* * * * *